US 10,097,187 B2

(12) United States Patent
Doare et al.

(10) Patent No.: US 10,097,187 B2
(45) Date of Patent: Oct. 9, 2018

(54) DIGITAL SYNTHESIZER, RADAR DEVICE AND METHOD THEREFOR

(71) Applicant: NXP USA, Inc., Austin, TX (US)

(72) Inventors: Olivier Vincent Doare, La Salvetat St Gilles (FR); Didier Salle, Toulouse (FR); Birama Goumballa, Larra (FR); Cristian Pavao Moreira, Frouzins (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/710,154

(22) Filed: Sep. 20, 2017

(65) Prior Publication Data

US 2018/0145692 A1 May 24, 2018

(30) Foreign Application Priority Data

Nov. 23, 2016 (EP) ..................... 16306544

(51) Int. Cl.
*H03L 7/099* (2006.01)
*H03L 7/091* (2006.01)
(Continued)

(52) U.S. Cl.
CPC .................. *H03L 1/00* (2013.01); *G01S 7/35* (2013.01); *H03L 7/091* (2013.01); *H03L 7/095* (2013.01);
(Continued)

(58) Field of Classification Search
CPC ......... H03L 1/00; H03L 7/091; H03L 7/0992; H03L 7/095; H03L 2207/50; G01S 7/35
See application file for complete search history.

(56) References Cited

U.S. PATENT DOCUMENTS

| 7,629,915 B2* | 12/2009 | Lin ...................... G04F 10/005 341/166 |
| 7,928,888 B1* | 4/2011 | Chiu .................... G04F 10/005 331/1 A |

(Continued)

FOREIGN PATENT DOCUMENTS

| EP | 3035536 A1 | 6/2016 |
| EP | 3059857 A1 | 8/2016 |

*Primary Examiner* — Kenneth B Wells

(57) ABSTRACT

A digital synthesizer is described that comprises: a ramp generator configured to generate a signal of frequency control words (FCW), that describes a desired frequency modulated continuous wave; a digitally controlled oscillator (DCO) configured to receive the FCW signal and generate a DCO output signal; a feedback loop comprising a time-to-digital converter (TDC), wherein the feedback loop is configured to feed back the DCO output signal; a phase comparator coupled to the ramp generator and configured to compare a phase of the FCW signal output from the ramp generator with the DCO output signal fed back from the DCO via the feedback loop and output a N-bit oscillator control signal in response thereto. The TDC receives a representation of the DCO output signal and a reference frequency signal to sample the DCO output signal and outputs multiple selectable delays of the DCO output signal. A digital synthesizer circuit sensor is configured to sense an operational condition of the digital synthesizer circuit and select one of the multiple selectable delays output from the TDC in response to the sensed operational condition. A re-timer circuit is coupled to the digital synthesizer circuit sensor and configured to synchronize the selected delayed DCO output signal with the reference frequency signal.

15 Claims, 6 Drawing Sheets

(51) Int. Cl.
*H03L 1/00* (2006.01)
*H03L 7/095* (2006.01)
*G01S 7/35* (2006.01)

(52) U.S. Cl.
CPC ........ *H03L 7/0992* (2013.01); *H03L 2207/50* (2013.01)

(56) References Cited

U.S. PATENT DOCUMENTS

| | | | |
|---|---|---|---|
| 7,999,707 B2* | 8/2011 | Park | G04F 10/06 341/118 |
| 8,155,256 B2 | 4/2012 | Staszewski et al. | |
| 8,508,266 B2* | 8/2013 | Frantzeskakis | H03L 7/08 327/147 |
| 8,570,081 B2* | 10/2013 | Ma | H03L 7/0814 327/158 |
| 8,570,082 B1 | 10/2013 | Kuo et al. | |
| 8,736,384 B2* | 5/2014 | Ravi | H03L 7/1978 327/141 |
| 9,742,549 B1* | 8/2017 | Wang | H04J 3/0647 |
| 2006/0103566 A1 | 5/2006 | Vemulapalli et al. | |
| 2014/0085012 A1 | 3/2014 | Wu et al. | |

* cited by examiner

DIGITAL SYNTHESIZER, RADAR DEVICE AND METHOD THEREFOR

CROSS-REFERENCE TO RELATED APPLICATIONS

This application claims priority under 35 U.S.C. § 119 to European patent application no. EP16306544.4, filed Nov. 23, 2016, the contents of which are incorporated by reference herein.

FIELD OF THE INVENTION

The field of the invention relates to a digital synthesizer having a digitally controlled oscillator in a digital phase locked loop circuit (DPLL), a radar device and a method therefor. In particular, the field relates to an all-digital PLL (ADPLL) for a frequency modulated continuous wave (FMCW) radar device configured to mitigate problems due to timing differences between a DCO output clock signal and a reference clock signal on a time-to-digital converter output.

BACKGROUND OF THE INVENTION

In many present day wireless communication applications, a digital synthesizer is used and often implemented by way of a digital phase locked loop (DPLL) that is used to control a digitally controlled oscillator (DCO) to generate (often referred to as 'synthesize') an output radio frequency (local oscillator) signal. Such digital synthesizers provide a benefit of being able to simplify the integration of the synthesizer circuitry within large scale integrated digital circuit devices, as compared with equivalent analogue synthesizers, thereby reducing size, cost, power consumption and design complexity. Furthermore, DPLLs intrinsically present lower phase noise than their analogue counterparts.

All-digital phase locked loops (ADPLLs) can be used as a frequency synthesizer in radio frequency circuits to create a stable local oscillator for transmitters or receivers, due to their low power consumption and high integration level. They can also be used to generate the frequency-modulated continuous wave (FMCW) waveforms required by a radar transmitter.

In a DPLL, data has to be transmitted from a DCO domain to a reference clock domain, preferably without synchronization loss within the loop of the DPLL. As the two domains are asynchronous, the inventors have recognized and appreciated that there is a need to build a mechanism to avoid any (asynchronous clock) metastability region. Metastability occurs when the order of arrival of clock edges is random, e.g. when two clocks are 'almost' edge-to-edge synchronous, but where an edge can therefore be lost. Any small jitter (variable delay) then causes the edges to be in reverse order, from one edge of a clock to the next, which causes un-predictable behavior. In a DPLL circuit, such metastability problems sometimes appear as a re-timing effect between a DCO output clock and a reference clock, which may cause errors on the Time-to-Digital Converter (TDC) output, and thereby generate spurs on the DCO output. The re-timing effect is caused due to the fact that the DCO clock is not synchronized with the reference clock. Known mechanisms to deal with the metastability region suffer from component tolerance variation due to, say, Process, Voltage, Temperature (PVT) effects.

U.S. Pat. No. 8,155,256 B2 describes a mechanism that hopes to find the optimal edge from a series of delays, to use in a re-timer circuit. However, the algorithm in U.S. Pat. No. 8,155,256 B2 selects a fixed choice of one delayed output of a TDC output that is used in a re-timer context to decide if CKV or CKVZ (i.e. inverted clock) signal should be used. Such a fixed clock decision and usage thereof has been found to be unable to work over typical, practical, PVT variations.

Accordingly, it is important to generate modulation signals for FMCW in a DPLL that is more insensitive to component tolerances, such as PVT, particularly for example in a re-timer operation.

SUMMARY OF THE INVENTION

The present invention provides a digital synthesizer, a communication unit, such as a radar device, and a method therefor as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

In accordance with some example embodiments of the present invention, there is provided a digital synthesizer and a method of generating a digital oscillator signal containing a PVT-insensitive Time-to-Digital Converter (TDC) circuit. Examples of the invention are described with reference to a Digital PLL, and it is envisaged that the concepts described herein may be included in a wide variety of application examples, such as 80 GHz Radar applications, 5 Ghz connectivity, car to car communication or 'vehicle to everything' (V2X) applications. Although examples of the invention are described with reference to a digital synthesizer employing FMCW DPLL circuits, it is envisaged that the concepts described herein are applicable to all DPLL circuits that use a TDC circuit.

In examples of the invention, a digital synthesizer includes a ramp generator configured to generate a signal of frequency control words (FCW) that describes a desired frequency modulated continuous wave; and a digitally controlled oscillator (DCO) configured to receive the FCW signal and generate a DCO output signal. A feedback loop is configured to feed back the DCO output signal; and a phase comparator coupled to the ramp generator is configured to compare a phase of the FCW output from the ramp generator and the DCO output signal fed back from the DCO via the feedback loop and output a N-bit oscillator control signal. A re-timer circuit is configured to synchronize the DCO output signal with a reference frequency signal that is input to the feedback loop. In examples of the invention, the re-timer circuit is coupled to a digital synthesizer circuit sensor configured to sense an operational condition of the digital synthesizer circuit and select one of multiple selectable delays for the re-timer circuit to use to synchronize the DCO output signal in response to the sensed operational condition. In some examples, the digital synthesizer circuit sensor is a component or circuit sensor that encompasses any sensor able to monitor an impact of, say, process, voltage and/or temperature, on delays of cells, such as buffers, inverters etc. Thus, the component or circuit sensor 382 monitors a combined impact on a parameter under consideration: e.g. delays of logic gates, or in general on the devices/elements/components used inside the TDC to measure a delay between two signals, which is the aim of the TDC. The digital synthesizer circuit sensor is then able to control a mechanism that compensates, say, for component or circuit performance changes under prevailing operational conditions, such as PVT variations, for example an ADPLL re-timer circuit.

Known ADPLLs have rarely been used in FMCW radar systems and devices, as yet, due to the extremely demanding phase-noise performances that are required in such systems and devices, and also very demanding level of spurious signals that are needed, which are extremely difficult to attain with an ADPLL.

Figure 1:
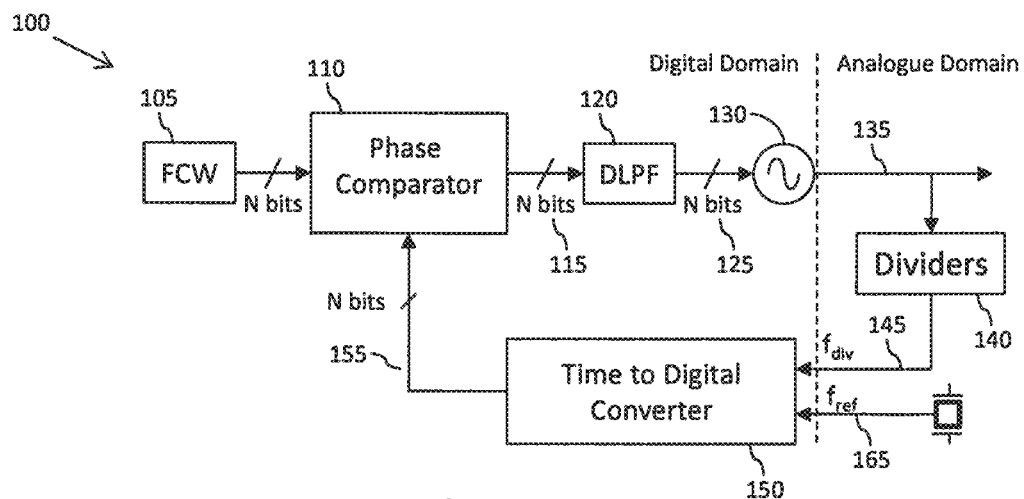
FIG. 1 illustrates a conventional digital phase locked loop design.

FIG. 1 illustrates a conventional digital phase locked loop (DPLL) 100. An N-bit digital frequency control word (FCW) 105 is provided to a phase comparator 110, which compares an N-bit digital feedback signal 155 to the FCW 105, and outputs an N-bit oscillator control signal 115 based on the comparison of the digital feedback signal 155 to the FCW 105. A digital low pass filter 120 filters the N-bit oscillator control signal 115, and outputs a filtered N-bit oscillator control signal 125, which is provided to a digitally controlled oscillator (DCO) 130. The DCO 130 outputs a frequency signal 135 based on the filtered N-bit oscillator control signal 125. A feedback path of the DPLL 100 consists of a divider 140 that divides the output frequency signal 135 to generate a frequency-divided signal 145, which is provided to a time-to-digital converter (TDC) 150. The TDC 150 also receives a reference frequency signal 165, which is used to sample the frequency-divided signal 145. The TDC 150 outputs the N-bit digital feedback signal 155 based on a measured time interval between the frequency-divided signal 145 and the reference frequency signal 165.

Phase noise introduced by the DPLL 100 of FIG. 1 is primarily due to the digital-to-analogue conversion performed by the DCO 130, and time-to-digital conversion performed by the time to digital converter 150 in the feedback path. In the known PLL circuit of U.S. Pat. No. 8,155,256 B2, which proposes a selection of a TDC output, U.S. Pat. No. 8,155,256 B2 does not explain how the selection of the TDC_Q output is made, just that one fixed output is used to generate a sel_edge signal that then decides if a retiming operation is performed on a rising or a falling edge of a fast clock signal.

A recognition that operational conditions of the digital synthesizer may cause variations of TDC delay elements, and in particular PVT-based variations of TDC delay elements, does not equate to a knowledge of what the variations are, or how they affect the circuit, or indeed how it may be possible to compensate for them. Therefore, examples of the invention propose a mechanism to monitor (e.g. sense) the operational conditions of the digital synthesizer, and in particular the PVT impact on TDC delay elements, and accordingly use a different output of the TDC delay chain in order to determine which edge of a DCO divided-down clock to use, in order to re-synchronize a reference clock (for example in integer counter and re-timer circuit 390 of FIG. 3).

Figure 2:
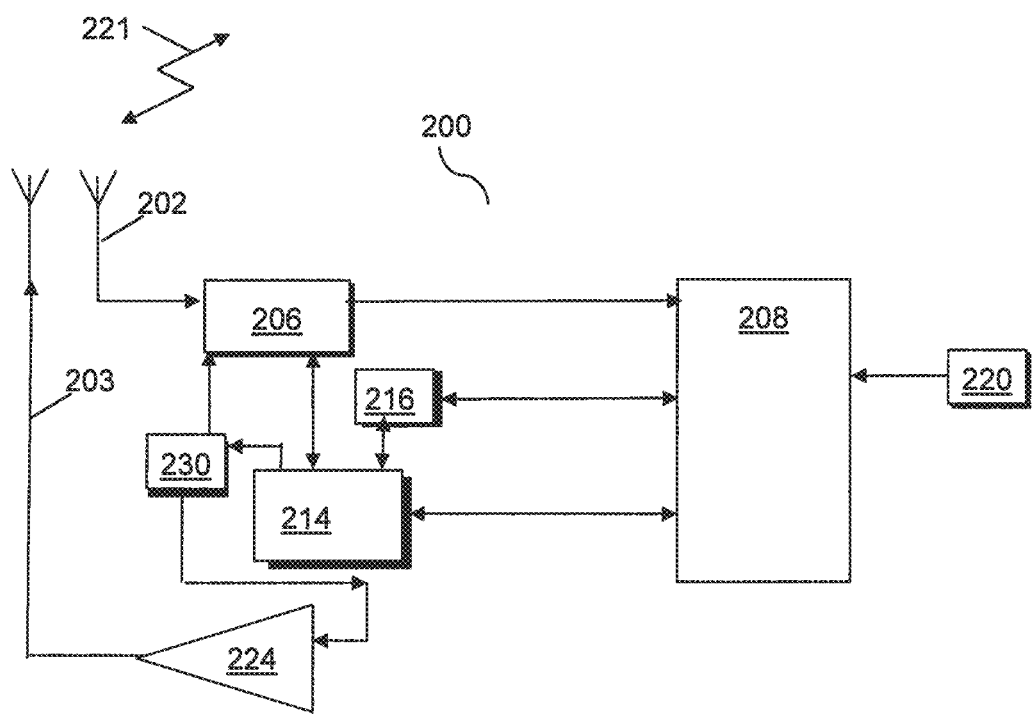
FIG. 2 illustrates a simplified block diagram of a radar device, adapted in accordance with examples of the invention.

Referring to FIG. 2, a block diagram of a wireless communication unit is shown, adapted in accordance with some examples of the invention. Purely for explanatory purposes, the wireless communication unit is described in terms of a radar device 200 operating at millimeter (MMW) frequencies. The radar device 200 contains one or several antennas 202 for receiving radar signals 221, and one or several antennas 203 for transmitting radar signals, with one shown for each for simplicity reasons only. The number of antennas 202, 203 used may depend on the number of radar receiver and transmitter channels that are implemented in a given radar device. One or more receiver chains, as known in the art, include receiver front-end circuitry 206, effectively providing reception, frequency conversion, filtering and intermediate or base-band amplification, and finally an analog-to-digital conversion. In some examples, a number of such circuits or components may reside in signal processing module 208, dependent upon the specific selected architecture. The receiver front-end circuitry 206 is coupled to the signal processing module 208 (generally realized by a digital signal processor (DSP)). A skilled artisan will appreciate that the level of integration of receiver circuits or components may be, in some instances, implementation-dependent.

The controller 214 maintains overall operational control of the radar device 200, and in some examples may comprise time-based digital functions (not shown) to control the timing of operations (e.g. transmission or reception of time-dependent signals, FMCW modulation generation, etc.) within the radar device 200. The controller 214 is also coupled to the receiver front-end circuitry 206 and the signal processing module 208. In some examples, the controller 214 is also coupled to a memory device 216 that selectively stores operating regimes, such as decoding/encoding functions, and the like.

As regards the transmit chain, this essentially comprises a power amplifier (PA) 224 coupled to the transmitter's one or several antennas 203, antenna array, or plurality of antennas. In radar device 200, radar transceiver topology is different from traditional wireless communication architectures (e.g. Bluetooth™, WiFi™ etc.), as modulation occurs within a phase locked loop (PLL) (typically via a fractional-N divider), and is applied directly to the PA 224. Therefore, in some examples, the receiver front-end circuitry 206 and transmitter PA 224 are coupled to frequency generation circuit 230 arranged to provide local oscillator signals. The generated local oscillator signals are thus modulated directly to generate transmit radar signals, and also used to down-convert received modulated radar signals to a final intermediate or baseband frequency or digital signal for processing in a receive operation.

Figure 3:
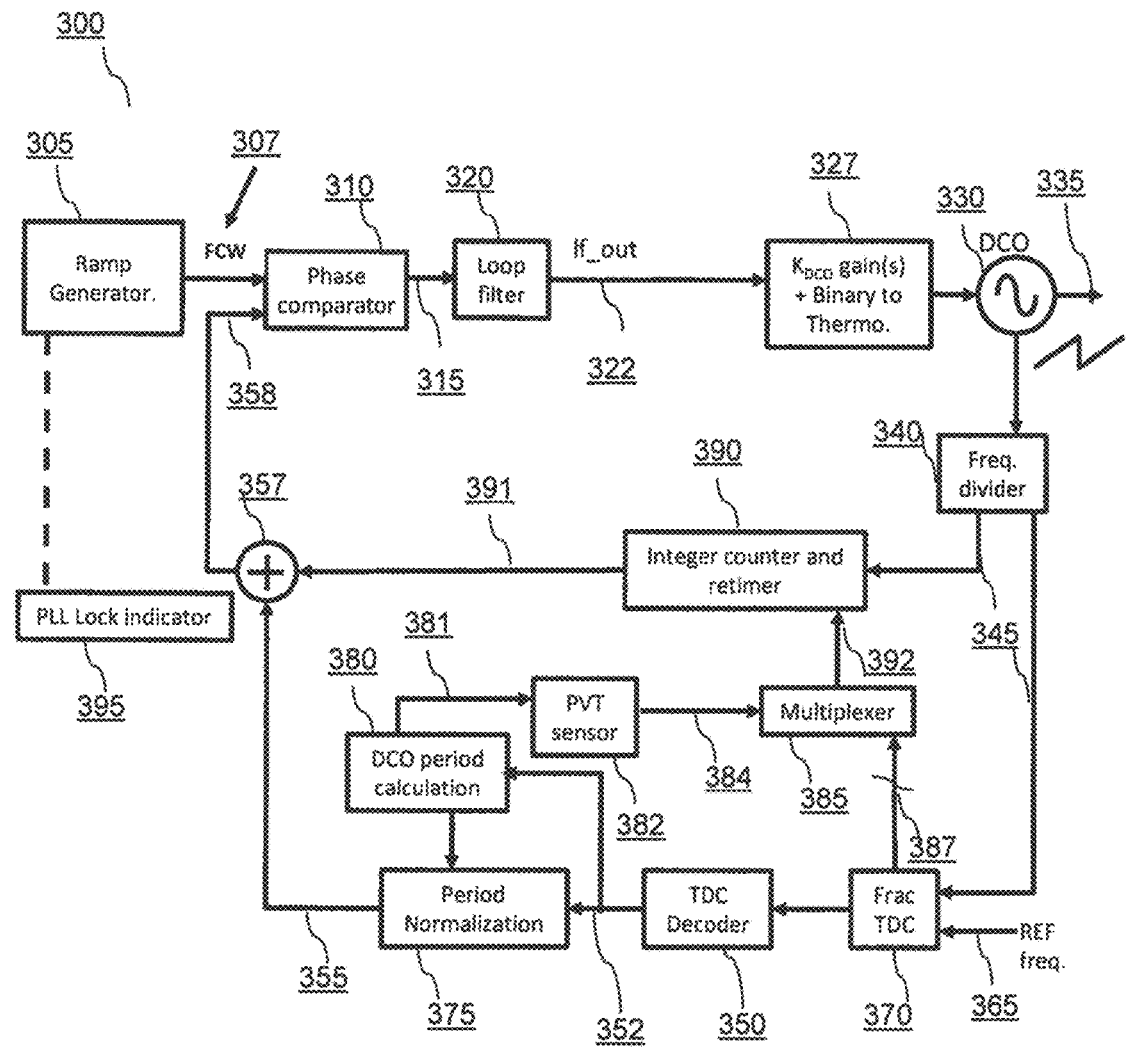
FIG. 3 illustrates a simplified circuit diagram of a first example of a digitally controlled oscillator circuit, in accordance with examples of the invention.

In accordance with examples of the invention, frequency generation circuit 230 includes a digital synthesizer comprising a ramp generator configured to generate a signal of frequency control words, FCW, that describes a desired frequency modulated continuous wave; a digitally controlled oscillator, DCO, configured to receive a FCW signal and generate a DCO output signal; a feedback loop configured to feed back the DCO output signal; and a phase comparator coupled to the ramp generator and configured to compare a phase of the FCW output from the ramp generator and the DCO output signal fed back from the DCO via the feedback loop and output a N-bit oscillator control signal, as described with reference to FIG. 3. A re-timer circuit is configured to synchronize the DCO output signal with a reference frequency signal input to the feedback loop. The re-timer circuit is coupled to a digital synthesizer circuit sensor configured to sense an operational condition of the digital synthesizer circuit and select one of multiple selectable delays for the re-timer circuit to use to synchronize the DCO output signal in response to the sensed operational condition.

In FIG. 2, a single signal processor may be used to implement a processing of receive signals. Clearly, the various components within the radar device 200 can be realized in discrete or integrated component form, with an ultimate structure therefore being an application-specific or design selection.

A skilled artisan will appreciate that the level of integration of circuits or components may be, in some instances, implementation-dependent.

FIG. 3 illustrates a simplified block diagram of a first example of a digital synthesizer, and more specifically a digital phase locked loop (DPLL) 300 that includes a digitally controlled oscillator (DCO) 330, in accordance with examples of the invention. In some examples, the DPLL may form part of the frequency generation circuit 230 of FIG. 2.

A ramp generator 305, generates an N-bit digital FCW signals 307 and provides the N-bit digital FCW signals 307 to a phase comparator 310, which compares fractional ratio information 355 of an N-bit digital feedback signal to the FCW signals 307, and outputs an N-bit oscillator control signal 315 based on the comparison of the digital feedback signal 358 to the FCW signals 307. A digital low pass (loop) filter 320 filters the output N-bit oscillator control signal 315, and outputs a filtered N-bit oscillator control signal to a gain circuit 327, which in this example is identified as a $K_{DCO}$ gain(s)+binary to thermometer gain circuit, where KDCO is the DCO gain. In essence, this results in a multiplication of a fixed gain (Kdco) that comes from a calibration of the DCO, in order to track the DCO gain. Thereafter, a decoder (not shown) converts binary code into thermometer code in order to control the DCO, as the DCO needs this type of data format.

The DCO 330 outputs a frequency signal 335. A feedback path of the DPLL 300 consists of a frequency divider 340 that divides the output frequency signal 335 to generate a frequency-divided clock signal 345, which is provided to a fractional time-to-digital converter (TDC) 370. The fractional TDC 370 also receives a reference frequency clock 365 that is used to sample the frequency-divided signal 345. The fractional TDC 370 routes the digital feedback signal to a TDC decoder 350 that decodes the digital feedback signal and outputs the decoded digital feedback signal 352 to a period normalisation circuit 375 configured to provide the result of the fractional TDC measurement, normalized to a period of the DCO frequency-divided clock signal 345.

The fractional TDC result, once normalized to the DCO divided-down period, is input to an summing junction 357, where it is added with an output from an integer counter and re-timer circuit 390 that also receives the frequency-divided clock signal 345.

The integer counter and re-timer circuit 390 has two roles: firstly it counts the number of integer period of the DCO frequency divided-down clock signal 345 in each period of the reference frequency clock 365, and also re-synchronizes this information with the DCO frequency divided-down clock signal 345, in order to generate a delayed DCO output 392 resynchronized with a clock edge of the reference frequency clock signal 365. Secondly, the integer counter and re-timer circuit 390 may generate a clock signal that may be provided to various circuits within the whole DPLL 300 system, which may include (but not shown for simplicity of the drawing) phase comparator 310, digital low pass (loop) filter 320, gain circuit 327, period normalisation circuit 375, etc.

In particular, in accordance with examples of the invention, the output resynchronized integer count information 391 is added in summing junction 357 to the fractional ratio information 355 generated by period normalisation circuit 375. The summing junction 357 outputs the digital signal 358, which consists of the integer and fractional ratio between the reference frequency and DCO frequency-divided clock signal 345 to the phase comparator 310.

Figure 7:
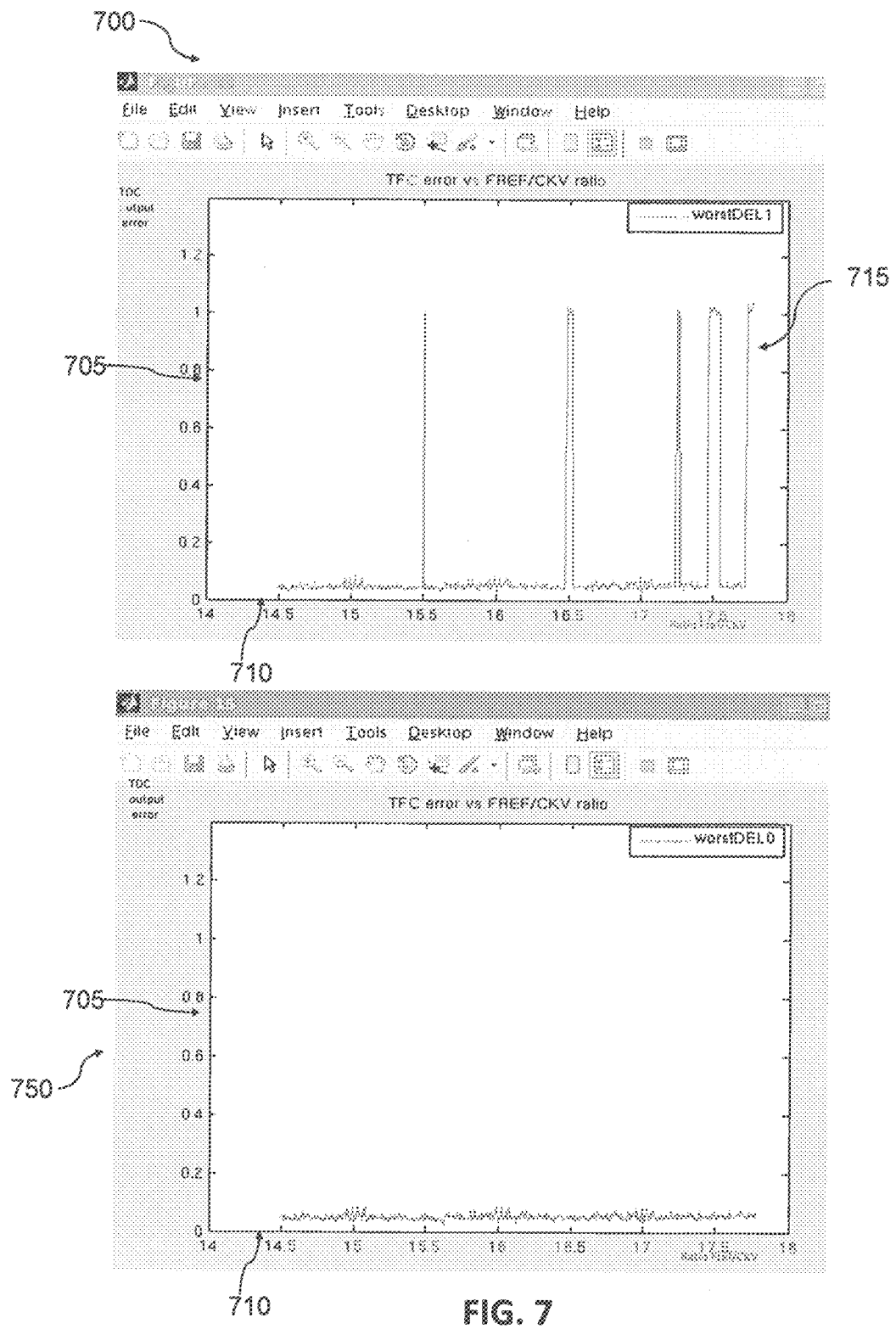
FIG. 7 illustrates two fast clock period (TFC) error diagrams, a first diagram showing timing glitches due to the DCO and reference frequency signals being close to one another and causing a metastability region problem, and a second showing the removal of the timing glitches when the DCO and reference frequency clock edges are close to one another when implementing examples of the invention.

As mentioned, any synchronisation error between the DCO frequency-divided clock signal 345 and a reference frequency signal may lead to spurious glitches (as illustrated in FIG. 7), which may inject a large phase error into the DPLL. This effect results in large jitter, or possibly driving the DPLL 'out of lock'. In some phase-switching applications, such as with a high-frequency divider, such glitches may be avoided by using slow rise times for the control signal, or by synchronizing the reference frequency signal with the DCO frequency-divided signal 345. However, such slow rise times are susceptible to process, temperature and/or voltage variations and any re-synchronization approaches a limit of the PLL speed due to the feedback loop delay. In this scenario, in examples of the invention, the integer counter and re-timer circuit 390 counts the number of integer period of the DCO divided-down clock signal 345 in each period of the reference frequency clock 365 and is used to synchronize the control signal in a feed forward manner to remove the possibility of glitches. The possibility of glitches is removed following a pre-determination of the effects of component or circuit operational changes, say as a result of PVT changes, and a consequent introduction of at least one delay, from multiple selectable delays. In this manner, a DCO clock edge may be distanced from a reference frequency clock edge, if needed and in response to such PVT changes, thereby negating the possibility of glitches.

In one example, a PLL lock indicator circuit 395 determines when the PLL is in a frequency 'lock' mode and accordingly informs the ramp generator 305, primarily as a safety system to avoid transmitting on unwanted (perhaps forbidden) frequencies.

In this example, the decoded digital feedback signal 352 is also input to a DCO period calculation circuit 380, which is configured to determine a suitable timing reference for a DCO clock period. In one example, this timing reference 352 is input to the period normalisation circuit 375, to be used as the identified DCO period in order to normalize the fractional DCO period measured by the TDC decoder 350. In one example, the DCO period calculation circuit 380 outputs timing reference 381 to a component or circuit sensor 382. In one example, the component or circuit sensor 382, may be a PVT-insensitive sensor that outputs a code that selects one particular input from multiple inputs 387 from the fractional TDC 370 that are input to the multiplexer 385.

In examples of the invention, the component or circuit sensor 382 encompasses any sensor able to monitor an impact of, say, process, voltage and/or temperature, on delays of cells such as buffers, inverters etc. Thus, the component or circuit sensor 382 monitors a combined impact on a parameter under consideration: e.g. delays of logic gates, or in general on the devices/elements/components used inside the TDC to measure a delay between two signals, which is the aim of the TDC.

In some examples, multiplexer 385 may be a simple multiplexer, for example with 'N' inputs to a single output. The selected input, from the multiple inputs 387 at the multiplexer 385, is based on a determination of the operation of components or circuits, as determined by component or circuit sensor 382, under the influence of the prevailing temperature, voltage or process conditions. The selected input 387 is then routed from the multiplexer 385 to the integer counter and retimer 390.

In accordance with examples, the intelligence for the selection of the input i.e. one of the TDC delayed outputs, from the multiple inputs 387 at the multiplexer 385, is based in the component or circuit sensor 382. The component or circuit sensor 382 may output a code based on a measured DCO period by the TDC, in a number of TDC delays. As the DCO frequency is known, the number of TDC delays in order to represent a DCO period allows the unit TDC delay to be measured, and thus select the optimum delay in multiplexer 385.

Thus, multiplexer 385 receives a plurality of inputs from fractional TDC 370, which in one example includes a plurality of delayed versions of the DCO output clock signal 345. Multiplexer 385 also receives a selection signal provided by component or circuit sensor 382. Based on the selection signal provided by component or circuit sensor 382, multiplexer 385 provides a selected delayed DCO output 392 resynchronized with a clock edge of the reference frequency clock signal 365, to the integer counter and re-timer circuit 390. A retimer operation is used in order to resynchronize (delaying an edge at a flip-flop to its output is synchronous to the flip-flop clock signal) the reference frequency clock 365 to the DCO divided down signal. Indeed the reference frequency clock 365 and DCO divided down clock are, by their nature, asynchronous if the ratio of the DCO divided down clock frequency over the reference frequency clock 365 is not an integer. The digital circuit cannot work with two asynchronous clocks. Hence, integer counter and retimer 390 creates a unique clock to the system, which is normalized by the output of the TDC decoder 350 to the DCO period by a division operation. After the TDC decoder 350, operations are carried out on numbers that represent times. However, in accordance with examples of the invention, the integer counter and retimer 390 operation works on timed signals (e.g. clocks, edges, etc.), which is very different to operations carried out on numbers that represent times.

Figure 4:
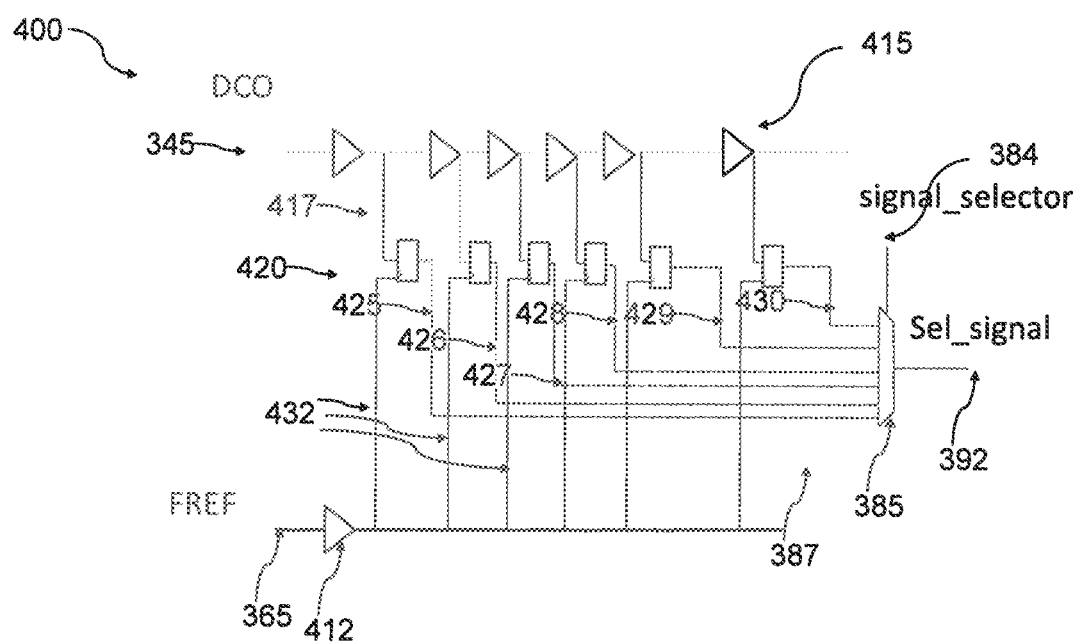
FIG. 4 illustrates a simplified circuit diagram of one example of a re-timer operation of the DCO circuit of FIG. 3, which is more insensitive to component tolerances, in accordance with examples of the invention.
Figure 5:
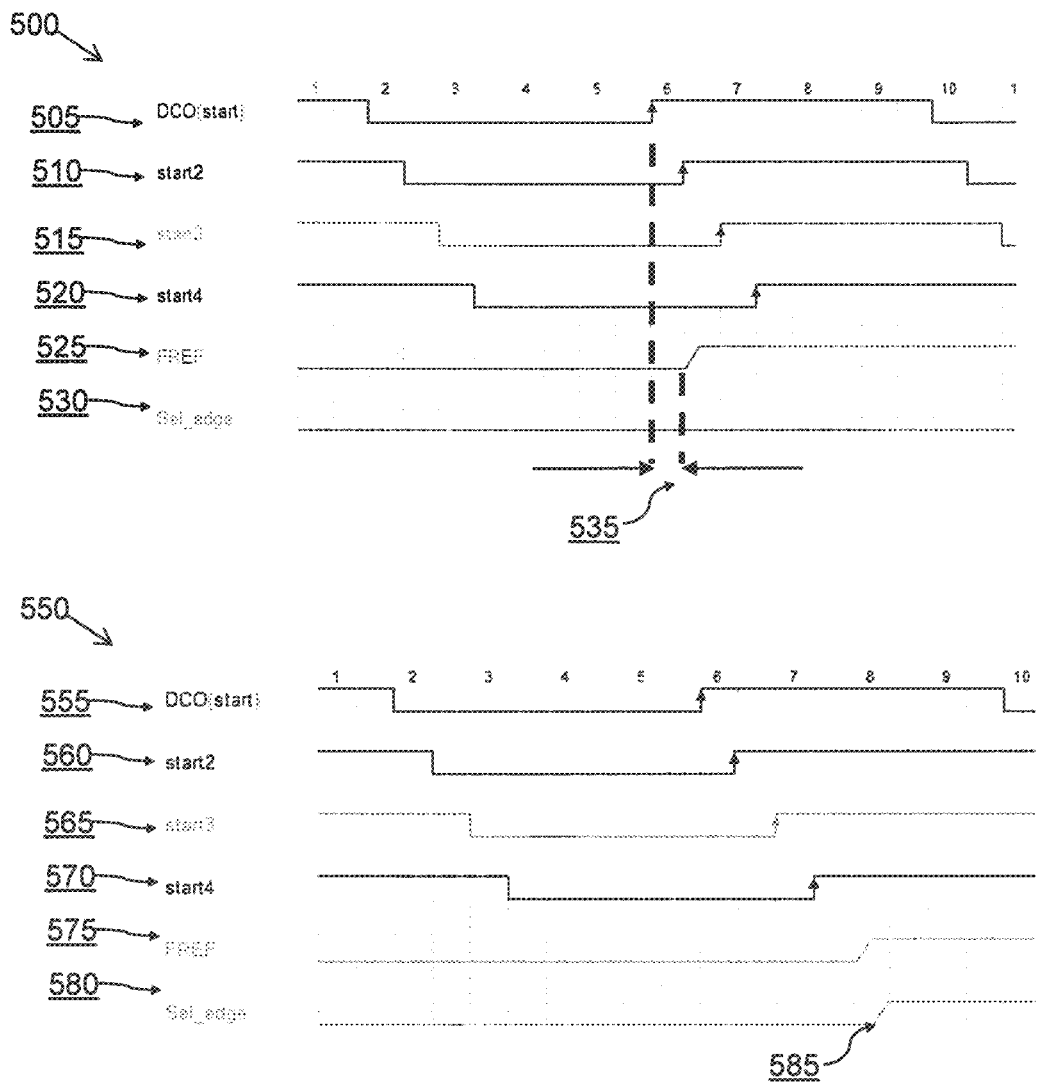
FIG. 5 illustrates timing diagrams associated with the operation of the simplified circuit diagram of FIG. 4, in accordance with examples of the invention.

Referring now to FIG. 4, a simplified circuit diagram 400 of one example of a sensor and re-timer and multiplexer operation of the DCO circuit of FIG. 3, which is more insensitive to component tolerances, is illustrated, in accordance with examples of the invention. The simplified circuit diagram 400 highlights the two domains, i.e. a DCO domain with a DCO output signal, such as DCO output signal 345 from FIG. 3, and a reference frequency domain with a reference frequency signal, such as reference frequency clock 365 from FIG. 3. In this example, the DCO output signal 345 is input to a series of delay elements or circuits, which in this example are buffers 415, with each delay element or circuit 415 introducing a ¼ period delay to the DCO output signal 345. As shown, outputs 417 from each delay element or circuit 415 are input to a respective flip flop from a series of sequential flip flops 420. The series of flip flops 420 are clocked by a buffered (i.e. delayed) representation 432 of the reference frequency clock 365, buffered by buffer 412. In some alternative examples, buffers 412 and 415 may be replaced by other delay elements or circuits, such as invertors, so long as the signals that are inverted are re-inverted somewhere in order to obtain consistent output data. The DCO delayed (and clocked) outputs 425-430 from the series of flip flops 420 are input to a multiplexer 385 that is configured to output a selected signal (Sel_signal), for example a delayed DCO output 392 resynchronized with a clock edge of the reference frequency clock signal 365, in response to an edge selector control signal 384. The edge selector control signal 384 is generated and applied by component or circuit sensor 382, e.g. a PVT-insensitive sensor In this example, as illustrated in FIG. 5, the DCO clock period is divided into sixteen time delay periods. It should be noted that only six sets of delays and flip flops are shown for simplicity purposes only, whereas in practice in this example sixteen sets of delays and sixteen flip flops would be used, leading to sixteen delayed timing waveforms being generated.

Referring now to FIG. 5, timing diagrams associated with the operation of the simplified circuit diagram of FIG. 4 are illustrated, in accordance with examples of the invention.

A first set of timing diagrams 500 of FIG. 5 is associated with the example circuit of FIG. 4. Here, a first DCO divided-down clock, CKV, timing waveform 505 represents the DCO output signal 345 of FIG. 4. Successive delayed timing waveform versions (510, 515, 520) of the DCO CKV 505 show the effects of ¼ period delays. A reference frequency timing waveform 525, which is substantially aligned 535 with the first DCO CKV 505 is illustrated. In accordance with examples of the invention, no edge selector signal is generated in Sel_edge waveform 530. The Sel_edge waveform 530 is the DCO CKV 505 sampled on reference frequency 525 delayed by ¼ DCO period, as shown. Thus, in this example, as no edge selector signal is generated, the actual DCO CKV 505 is used and selected by the multiplexer, e.g. multiplexer 385 from FIG. 3 and FIG. 4, rather than a delayed version thereof.

Thus, in this timing example when no edge selector signal is generated in Sel_edge waveform 530, this means that the DCO CKV 505 and the reference frequency (FREF) clock signal 525 are close to each other, e.g. within ¼ of DCO clock period in the integer counter and re-timer circuit 390.

In this instance, the reference frequency (FREF) clock signal 525 is sampled on the inverted clock signal, where CKVZ is CKV inverted, which equates to the DCO clock possibly divided down in frequency, in order to avoid metastability.

Thus, the reference frequency (FREF) clock signal 525 is resampled on the rising edge of the DCO CKV 505 if the CKV and FREF clock edges are NOT close to each other (thus sel_edge='1'). If the DCO CKV 505 and FREF clock edges are close to each other (meaning sel_edge='0') then the inverted DCO divided-down clock, CKVZ, is used to resample FREF clock signal 525, which means that FREF clock signal 525 is re-sampled on the falling edge of CKV.

It should be noted that only three delayed timing waveforms are shown for simplicity purposes only, whereas in practice in this example sixteen delayed timing waveforms would be generated.

A second set of timing diagrams 550 of FIG. 5 is associated with the example circuit of FIG. 4 when the clock edges of the DCO divided-down clock, CKV, and reference frequency clock signal 525 are not deemed close together in a timing sense. Here, a first DCO CKV clock 555 represents the DCO clock signal 345 from FIG. 4. Successive delayed timing waveform versions (560, 565, 570) of the DCO CKV clock 555 show the effects of ¼ period delays. A reference frequency (FREF) clock 575, which is misaligned with the first DCO CKV clock 555 is illustrated. In accordance with examples of the invention, an edge selector signal waveform 580 illustrates the selected, delayed version of the DCO output signal that is output from multiplexer 540 and that has an edge 585 that is consistent with FREF clock 575. This signal is selected from the various (up to sixteen in this example) flip-flop outputs 425-430 of FIG. 4.

In this example, the FREF clock 575 has to be sampled on CKV, where CKV=DCO clock, possibly divided down, in order to avoid a metastability region. Metastability occurs when the clock edges and data edges on a flip-flop are very close to each other, a phenomena that needs to be avoided.

Thus, in this manner and in order to remove the potential metastability region, a decision of which delayed (DCO) timing signal is made by selecting a particularly delayed DCO signal that is sufficiently close to the FREF clock 575 edges, which in some examples may be around a ¼ of DCO period. Here, the sel_edge signal 530 is the output of the TDC that has approximately a ¼ DCO divided-down (CKV) period delay, even though the unit delay in the TDC is shown here for simplicity to be 1/16 the DCO period. Thus, in this illustrated example, the start signal 570 is sampled by the FREF clock 575.

In accordance with example embodiments of the invention, the selection of a number of inverter delays that are used is dependent upon component or circuit tolerances according to the prevailing conditions, e.g. they change with one or more of, say, PVT. As a consequence, the inventors of the present invention have proposed an illustrated example circuit that is capable of performing a variable number of sub-period delays to address any PVT issues that are prevalent at any time, thereby avoiding re-timing signals entering a metastability region.

Figure 6:
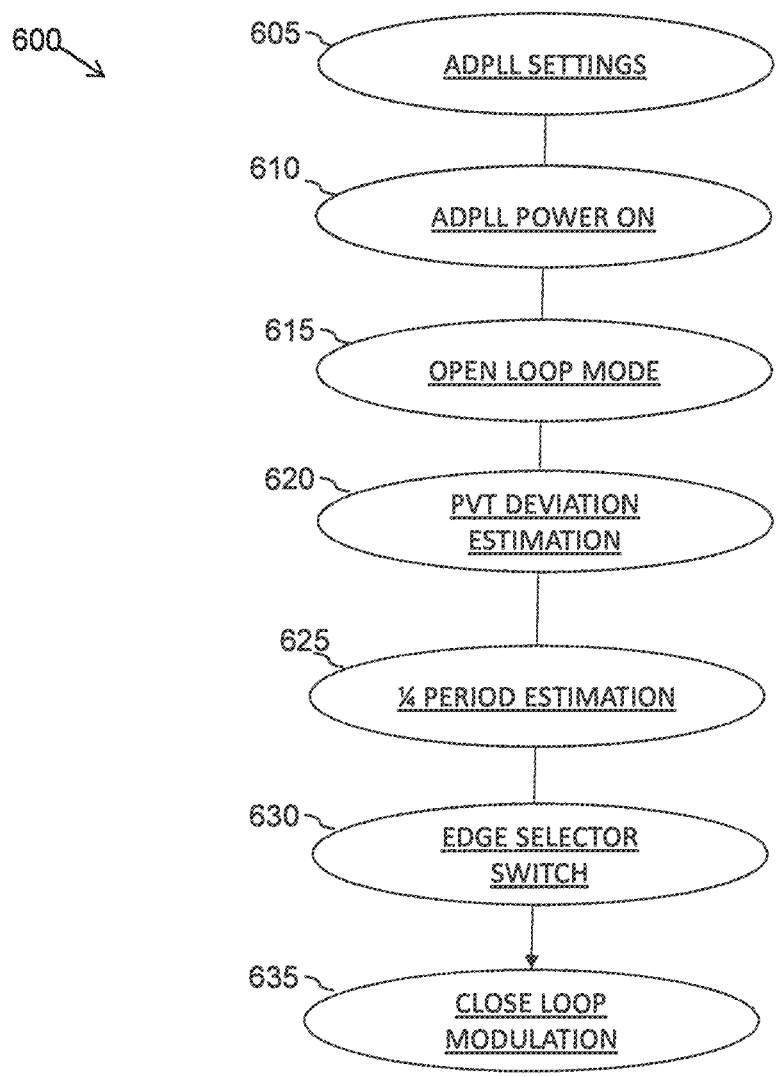
FIG. 6 illustrates a simplified flowchart of an example of a method of generating modulation signals for FMCW in a DPLL that is more insensitive to component tolerances, such as PVT, for example in a re-timer operation, in accordance with examples of the invention.

FIG. 6 illustrates an example simplified flowchart 600 of a method of generating modulation signals for FMCW in a DPLL that is more insensitive to component tolerances, such as PVT, for example in a re-timer operation, in accordance with examples of the invention.

At 605, the flowchart starts, with, say, the loading of DPLL (or ADPLL) initial settings. For example, such example setting may include: a DCO center frequency (FDCO) is set to 20 GHz, a DCO frequency divider ratio (e.g. as set by frequency divider 340 of FIG. 3) is set as: DIV_RATIO=16; and reference frequency (FREF) is set as: FREF=80 MHz, etc.

At 610, the DPLL (or ADPLL) may be turned on. At 615, the DPLL (or ADPLL) is started in an open loop mode, whereby the equivalent of a 20 GHz digital control signal is used to control the DCO.

At 620, a component or circuit estimation is performed based on the prevailing operating conditions, which in one example includes determining one or more component or circuit values in response to one or more of: process, temperature, voltage, changes, etc. Here, in one example, the TDC input frequencies are known, F_TDC=F_DCO/DIV_RATIO, and the TDC frequency is compared to the reference frequency. For example, an estimation may include estimating one or more of the following:

Expected period of the TDC output signal (CKV): T_TDC_expected=800 ps,

DELAYS_per_period_expected=800/9.17 ps=82,

DELAYS_per_period_measured=40, PVT_DEV=40/82, etc.

At 625, a ¼-period estimation is then performed of the FDCO/DIV_RATIO. Here, for example, the estimation may yield: ¼ period is typ=82/4=20 DELAYS, and ¼ period in example=40/4=10 DELAYS.

For example, a typical expected unit delay in TDC is 9/17 ps. That means when the TDC measures a typical CKV period of 800 ps with the unit delay of 9.17 ps, it will measure that one CKV period corresponds to 82 unit delays. This is the expected typical measured period, i.e. a TDC output number. Thus ¼ DCO period will occur on output of the TDC that has ~20 delays (=82/4). Therefore, a PVT sensor output, for example PVT sensor output 384 of FIG. 3, will cause the multiplexer 385 to send to the integer counter and re-timer circuit 390 the output with 20 delays from the TDC.

Now, for a particular PVT case, in reality the measured CKV period by the TDC is 40 (meaning 40 unit delays), it means that the impact of PVT variations on TDC unit delay is 40 (real delays) divided by 82 (typical unit delays). In this case, one period of CKV being 40 delays and not 82, ¼ of the DCO period corresponds to the TDC output with 40 delays (=40/4). In accordance with examples of the invention, this output will be selected by multiplexer 385.

At 630, an edge selector switch is, or may be, selected or switched in response to, say, the PVT deviation in 620 and the ¼-period estimation in 625. At 635, the loop is closed and the modulation commences with the DPLL (or ADPLL) starting in a normal operational mode. In this manner, the delays in the TDC are used to measure the DCO period (which does not need to be known) and track the delays that are used to generate the ¼ period of the DCO, e.g. start1 to start16 (not shown) in FIG. 5.

In some examples, the flowchart of FIG. 6 is followed at each power-on. Voltage and process do not change after power-up as they are linked to process variations of regulators and devices in general; but temperature does. The largest impact on delays is process, which is fixed for a given die. If temperature changes too much and causes a delay to change significantly, some examples require the steps of the flowchart to be re-performed. In some examples, for example with ADPLLs that are running in a burst-mode and not running continuously to save power, power up may occur often enough to follow temperature changes that tend to be slow.

Referring now to FIG. 7, two timing diagrams of fast clock period ($T_{FC}$) error performance are illustrated. A first TFC error timing diagram shows timing glitches due to the DCO and reference frequency signals being close to one another and causing a metastability region problem. A second TFC error timing diagram shows the removal of the timing glitches when the DCO and reference frequency signals are close to one another, where the potential metastability region problem is removed following implementing examples of the invention.

FIG. 7 illustrates an example of measured fast clock period ($T_{FC}$) error results 705 versus reference frequency/ CKV ratio 710. A first timing diagram 700 includes a default setting on a known DPLL circuit that produces a number of glitches 715, as shown, which illustrates a result of integer errors identified on the TDC output. Thus, in a prior art circuit when no prevailing component or circuit compensation (such as PVT compensation) is performed, the TDC is not able to correctly perform its function. In effect, the re-timer circuit has introduced an integer error on the TDC output, which has caused spurs on the DCO output. A second timing diagram 750 shows a performance of a DPLL circuit, according to examples of the invention, where the glitches are removed by employing the component or circuit sensor circuit, such as a PVT-insensitive sensor, as hereinbefore described.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented that achieve the same functionality.

Any arrangement of components to achieve the same functionality is effectively 'associated', such that the desired functionality is achieved. Hence, any two components herein combined to achieve a particular functionality can be seen as being 'associated with' each other, such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations are merely illustrative. The multiple operations may be executed at least partially overlapping in time. Moreover, alternative example embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in wireless programmable devices or units able to perform the desired device functions by operating in accordance with suitable program code.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A digital synthesizer comprising:
   a ramp generator configured to generate a signal of frequency control words, FCW, that describes a desired frequency modulated continuous wave;
   a digitally controlled oscillator, DCO, configured to receive the FCW signal and generate a DCO output signal;
   a feedback loop comprising a time-to-digital converter, TDC, wherein the feedback loop is configured to feed back the DCO output signal; and a phase comparator coupled to the ramp generator and configured to compare a phase of the FCW signal output from the ramp generator with the DCO output signal fed back from the DCO via the feedback loop and output a N-bit oscillator control signal in response thereto;

wherein the digital synthesizer is characterized in that:

the TDC receives a representation of the DCO output signal and a reference frequency signal to sample the DCO output signal and outputs multiple selectable delays of the DCO output signal;

a digital synthesizer circuit sensor is configured to sense an operational condition of the digital synthesizer circuit and select one of the multiple selectable delays output from the TDC in response to the sensed operational condition; and a re-timer circuit is coupled to the digital synthesizer circuit sensor and configured to synchronize the selected delayed DCO output signal with the reference frequency signal.

2. The digital synthesizer of claim 1, wherein the digital synthesizer circuit sensor is configured to sense at least one operational condition of the digital synthesizer circuit from a group comprising: process, temperature, voltage.

3. The digital synthesizer of claim 1 wherein the digital synthesizer circuit sensor outputs a code based on a measured DCO period by the TDC, indicative of a number of TDC delays to represent a DCO period and thereby one of the multiple selectable delays output from the TDC to be selected.

4. The digital synthesizer of claim 1, further comprising a DCO period calculation circuit configured to receive a TDC fed back output signal and output a DCO period calculation measurement to the digital synthesizer circuit sensor.

5. The digital synthesizer of claim 4, wherein the digital synthesizer circuit sensor is configured to use the DCO period calculation measurement to identify a delayed version of the multiple selectable delays of the DCO output signal to be provided to the re-timer circuit.

6. The digital synthesizer of claim 4, wherein the selected delayed version of the multiple selectable delays includes an indication of whether to: synchronize the DCO output signal, CKV, with the reference frequency signal or synchronize an inverse of the DCO output signal, CKVZ, with the reference frequency signal.

7. The digital synthesizer of claim 1 wherein the TDC is a fractional TDC configured to receive both a frequency divided version of the DCO output signal and the reference frequency signal, and produce therefrom multiple versions of the DCO output signal, each having different delays.

8. The digital synthesizer of claim 7, further comprising a multiplexer configured to receive the multiple versions of the DCO output signal from the fractional TDC and select one delayed DCO output signal as an output from the multiplexer that is input to the re-timer circuit.

9. The digital synthesizer of claim 7, wherein the fractional TDC comprises a series of sequential clocked gates, each clocked gate receiving a different delayed DCO output signal and clocked by an inverted or buffered representation of the reference frequency signal in order to produce the multiple versions of the DCO output signal, each having different delays.

10. The digital synthesizer of claim 8, wherein the digital synthesizer circuit sensor is configured to output a multiplexer signal select signal based on the sensed operational condition of the digital synthesizer circuit such that the multiplexer selects one of the multiple selectable delays for the re-timer circuit to use to synchronize the DCO output signal to the reference frequency.

11. The digital synthesizer of claim 1 wherein the re-timer circuit comprises an integer counter configured to count a number of integer periods of the DCO output signal in each period of the reference frequency clock, in order to generate a delayed DCO output signal resynchronized with a clock edge of the reference frequency clock signal.

12. The digital synthesizer of claim 11 wherein the delayed resynchronized DCO output signal is added in a summing junction to fractional ratio information generated by a period normalisation circuit.

13. The digital synthesizer of claim 12 wherein the summing junction outputs digital signal, which consists of integer and fractional ratio information between the reference frequency clock and a DCO frequency-divided clock signal to the phase comparator.

14. A radar device having a digital synthesizer comprising:

a ramp generator configured to generate a signal of frequency control words, FCW, that describes a desired frequency modulated continuous wave;

a digitally controlled oscillator, DCO configured to receive the FCW signal and generate a DCO output signal;

a feedback loop comprising a time-to-digital converter, TDC, wherein the feedback loop is configured to feed back the DCO output signal; and a phase comparator coupled to the ramp generator and configured to compare a phase of the FCW signal output from the ramp generator with the DCO output signal fed back from the DCO via the feedback loop and output a N-bit oscillator control signal in response thereto; and wherein the digital synthesizer is characterized in that:

the TDC receives a representation of the DCO output signal and a reference frequency signal to sample the DCO output signal and outputs multiple selectable delays of the DCO output signal;

a digital synthesizer circuit sensor is configured to sense an operational condition of the digital synthesizer circuit and select one of the multiple selectable delays output from the TDC in response to the sensed operational condition; and a re-timer circuit is coupled to the digital synthesizer circuit sensor and configured to synchronize the selected delayed DCO output signal with the reference frequency signal.

15. A method for generating modulation signals in a digital phase locked loop, DPLL, using a re-timer for synchronization that is insensitive to component tolerances, the method comprising:

generating a signal of frequency control words, FCW, that describes a desired frequency modulated continuous wave;

generating a digitally controlled oscillator, DCO, output signal in response to the FCW signal;

feeding back the DCO output signal via a time-to-digital converter, TDC; and comparing a phase of the FCW signal with the DCO output signal and, in response thereto, outputting a N-bit oscillator control signal;

wherein the method is characterised by:

sampling the DCO output signal using a reference frequency signal to generate multiple selectable delays of the DCO output signal;

sensing an operational condition of the digital synthesizer circuit;
selecting one of multiple selectable delays output from the TDC in response to the sensed operational condition; and
synchronizing the selected delayed DCO output signal with the reference frequency signal.

\* \* \* \* \*